US011112893B2

(12) United States Patent
Kano et al.

(10) Patent No.: US 11,112,893 B2
(45) Date of Patent: Sep. 7, 2021

(54) DISPLAY DEVICE WITH PIEZOELECTRIC ELEMENT

(71) Applicant: Murata Manufacturing Co., Ltd., Nagaokakyo (JP)

(72) Inventors: Hidekazu Kano, Nagaokakyo (JP); Nobuhito Tsubaki, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 41 days.

(21) Appl. No.: 15/867,950

(22) Filed: Jan. 11, 2018

(65) Prior Publication Data

US 2018/0136756 A1 May 17, 2018

Related U.S. Application Data

(63) Continuation of application No. PCT/JP2016/072893, filed on Aug. 4, 2016.

(30) Foreign Application Priority Data

Aug. 7, 2015 (JP) .............................. JP2015-156679

(51) Int. Cl.
*G06F 3/041* (2006.01)
*H01L 27/32* (2006.01)
(Continued)

(52) U.S. Cl.
CPC .............. *G06F 3/0412* (2013.01); *G01L 1/16* (2013.01); *G06F 3/0445* (2019.05); *H01L 27/323* (2013.01); *H01L 27/3225* (2013.01);
*G02B 6/0045* (2013.01); *G02B 6/0051* (2013.01); *G02B 6/0053* (2013.01);
(Continued)

(58) Field of Classification Search
CPC ....... G01L 1/16; G06F 3/0414; G06F 3/0412; G06F 2203/04103; G06F 2203/04105
See application file for complete search history.

(56) References Cited

U.S. PATENT DOCUMENTS 6,831,241 B2 * 12/2004 Fukui ...................... G06F 3/041
200/512
2006/0262072 A1 11/2006 Murakami et al.
(Continued)

FOREIGN PATENT DOCUMENTS

CN 102454926 A 5/2012
CN 203825334 U 9/2014
(Continued)

OTHER PUBLICATIONS

International Search Report issued in International Application No. PCT/JP2016/072893, dated Nov. 8, 2016.
(Continued)

*Primary Examiner* — Yuzhen Shen
(74) *Attorney, Agent, or Firm* — Arent Fox LLP

(57) ABSTRACT

A display device includes a display portion, a light source, a reflecting member, and a piezoelectric element. The display portion displays an image. The light source outputs light to the display portion. The reflecting member is provided on one side of a principal surface of the display portion and reflects the light of the light source. The piezoelectric element is provided on one side of the principal surface of the reflecting member.

9 Claims, 9 Drawing Sheets

(51) Int. Cl.
*G06F 3/044* (2006.01)
*G01L 1/16* (2006.01)
*F21V 8/00* (2006.01)
*G02F 1/1333* (2006.01)

(52) U.S. Cl.
CPC ........ *G02B 6/0055* (2013.01); *G02F 1/13338* (2013.01); *G06F 2203/04105* (2013.01)

(56) References Cited

U.S. PATENT DOCUMENTS

| | | | | |
|---|---|---|---|---|
| 2007/0199186 | A1* | 8/2007 | Yoshino | H03H 3/02 29/25.35 |
| 2009/0046072 | A1* | 2/2009 | Emig | G06F 3/044 345/173 |
| 2012/0075226 | A1* | 3/2012 | Andoh | G06F 3/041 345/173 |
| 2012/0099341 | A1 | 4/2012 | Kwon et al. | |
| 2013/0027339 | A1* | 1/2013 | Kodani | G01L 1/16 345/173 |
| 2014/0049137 | A1* | 2/2014 | Ando | G01B 7/16 310/330 |
| 2015/0036200 | A1* | 2/2015 | Matsushita | H01L 41/0478 359/198.1 |
| 2015/0116231 | A1 | 4/2015 | Kim | |
| 2015/0370386 | A1 | 12/2015 | Yamaguchi et al. | |
| 2016/0124560 | A1* | 5/2016 | Watazu | H01L 41/0478 345/173 |
| 2016/0306481 | A1* | 10/2016 | Filiz | G01L 1/146 |
| 2016/0364063 | A1* | 12/2016 | Wang | G06F 1/3262 |

FOREIGN PATENT DOCUMENTS

| | | |
|---|---|---|
| JP | H11-142839 A | 5/1999 |
| JP | 2006-126997 A | 5/2006 |
| JP | 2006-330790 A | 12/2006 |
| JP | 2013-156888 A | 8/2013 |
| JP | 2014-49011 A | 3/2014 |
| JP | 2015-88169 A | 5/2015 |
| JP | 2015-95696 A | 5/2015 |
| JP | 5736551 B1 | 6/2015 |

OTHER PUBLICATIONS

Written Opinion of the International Searching Authority issued in International Application No. PCT/JP2016/072893, dated Nov. 8, 2016.

* cited by examiner

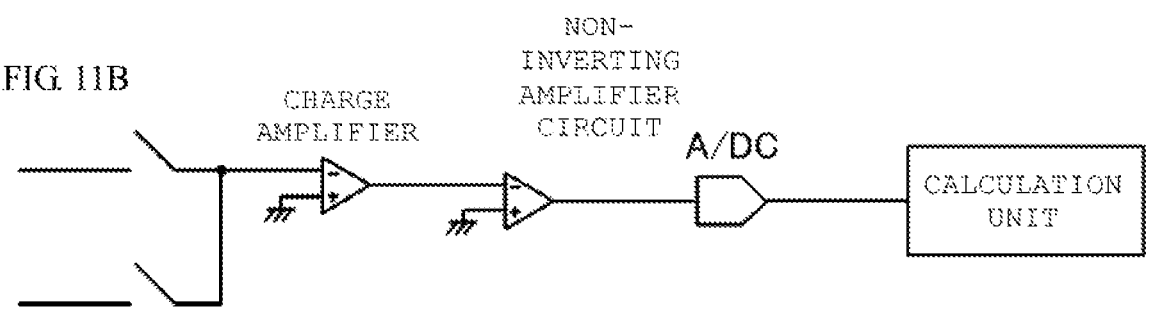

DISPLAY DEVICE WITH PIEZOELECTRIC ELEMENT

CROSS REFERENCE TO RELATED APPLICATIONS

The present application is a continuation of International application No. PCT/JP2016/072893, filed Aug. 4, 2016, which claims priority to Japanese Patent Application No. 2015-156679, filed Aug. 7, 2015, the entire contents of each of which are incorporated herein by reference.

TECHNICAL FIELD

The present invention relates to a display device including a display portion.

BACKGROUND ART

Japanese Patent Application Laid-Open No. 2006-126997 and Japanese Patent Application Laid-Open No. 2015-095696 disclose display devices, each of which includes a display portion and a touch panel for detecting a pressing force to an operation surface. In each of these display devices a piezoelectric element is disposed on an outer peripheral portion of the touch panel and the pressing force to the operation surface is detected by the piezoelectric element.

However, when the piezoelectric element is disposed on the outer peripheral portion of the touch panel it is difficult to detect minute displacement in a normal direction of the operation surface.

One possible solution is to provide the piezoelectric element between a back surface of the operation surface and the touch panel. However, if the piezoelectric element is provided between the back surface of the operation surface and the touch panel, noise generated from the touch panel or the display portion may affect the piezoelectric element. In addition, the piezoelectric element may affect display performance of the display portion.

BRIEF DESCRIPTION OF THE INVENTION

The present invention provides a display device that has an arrangement mode of the piezoelectric element, in which an influence of the noise is eliminated and an influence on the display performance of the display portion is eliminated.

A display device according to certain aspects of the invention comprises:
an operation panel;
a display located below the operation panel for displaying an image through the operation panel;
a light source located below the display for outputting light to the display;
a piezoelectric element located below the light source for detecting a pressing force applied to the operation panel, whereby the light source is located between the display and the piezoelectric element; and
a reflector located below the light source for reflecting light emitted by the light source toward the display.

In this manner, the piezoelectric element is disposed below a backlight unit (the light source and the reflecting member) with the back light unit being interposed between the piezoelectric element and the display. As a result, the piezoelectric element does not affect the performance of the display. In addition, the noise from the display does not affect the piezoelectric element.

In accordance with another aspect of the invention, the display device comprises:
an operation panel;
a display located below the operation panel for displaying an image;
a light shielding member located below the display; and
a piezoelectric element located below the light shielding member such that the light shielding member is located between the display and the piezoelectric element.

In this case, the use of an OLED display obviates the need for a backlight. However, the piezoelectric element does not affect the display performance of the display because of the presence of the light shielding member. In addition, the noise from the display does not affect the piezoelectric element.

In both aspects of the invention it is preferable that the piezoelectric element has first and second opposed principal surfaces, the first principal surface facing the light source, the second principal surface facing away from the light source and that a first electrode be disposed on the first principal surface of the piezoelectric element and be grounded. This improves a noise blocking effect. The first electrode can be made of a reflective material and can act as the reflecting member with the result that a thinner display device can be obtained.

In accordance with the present invention, the arrangement mode of the piezoelectric element can be provided, in which the influence of the noise is eliminated and the influence on the display performance of the display portion is eliminated or at least significantly reduced.

BRIEF EXPLANATION OF DRAWINGS

FIG. 11B is a circuit diagram of the piezoelectric sensor according to Modified Example 1.

DETAILED DESCRIPTION OF THE PREFERRED EMBODIMENTS

Hereinafter, a display device including a piezoelectric element of the present invention will be described with reference to the drawings.

Figure 1:
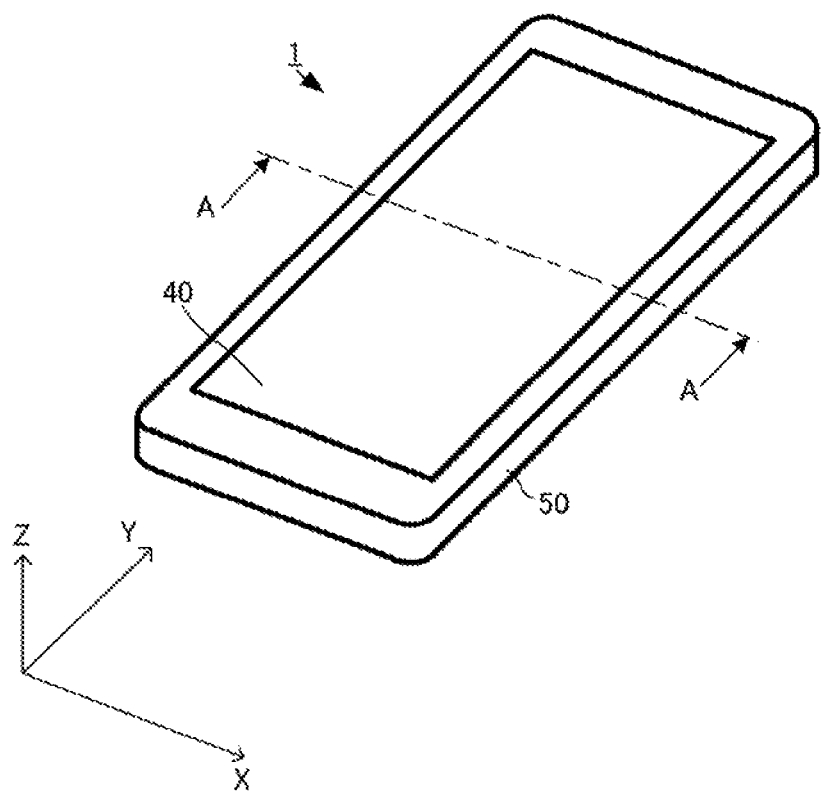
FIG. 1 is an external perspective view of a display device.

As illustrated in an external perspective view of FIG. 1, a display device 1 includes a housing 50 having a cuboid shape and a surface panel 40 having a planar shape. The surface panel is disposed in an opening on an upper surface of the housing 50 and functions as an operation surface on which a user performs a touching operation using a finger, a pen or other object.

For ease of explanation, the width direction (horizontal direction) of the housing 50 will be referred to as an X direction, the length direction (vertical direction) of the housing 50 will be referred to as a Y direction, and the thickness direction of the housing 50 will be referred to as a Z direction. In the following description the relative positions of various elements are referred to as being above or below one another. This is obviously a relative description depending on the orientation of the display device. These term as used in the description and claims refer to the position of the elements when the display device is oriented as shown in FIGS. 1 and 2.

Figure 2:
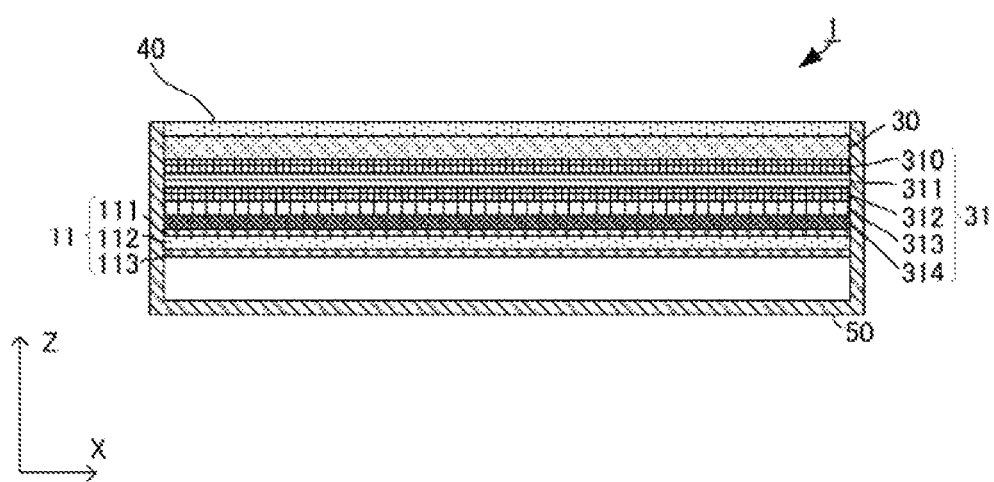
FIG. 2 is a cross-sectional side view of the display device.

As illustrated in FIG. 2, in an inside of the housing 50, a display (in the preferred embodiment a display panel) 30, a backlight 31 and a piezoelectric sensor 11 are disposed along the Z direction in order from an opening (surface panel 40) side of the housing 50. The piezoelectric sensor 11 and the surface panel 40 form a touch panel.

The piezoelectric sensor 11, the display panel 30 and the backlight 31 have a flat shape, and are individually disposed inside the housing 50 so as to face or extend along the opening (surface panel 40) of the housing 50.

Between a bottom surface of the housing 50 and the piezoelectric sensor 11, a circuit board (not illustrated) is disposed. On the circuit board, circuit modules which configure a detecting unit 20 (illustrated in FIG. 4) are provided.

Figure 4:
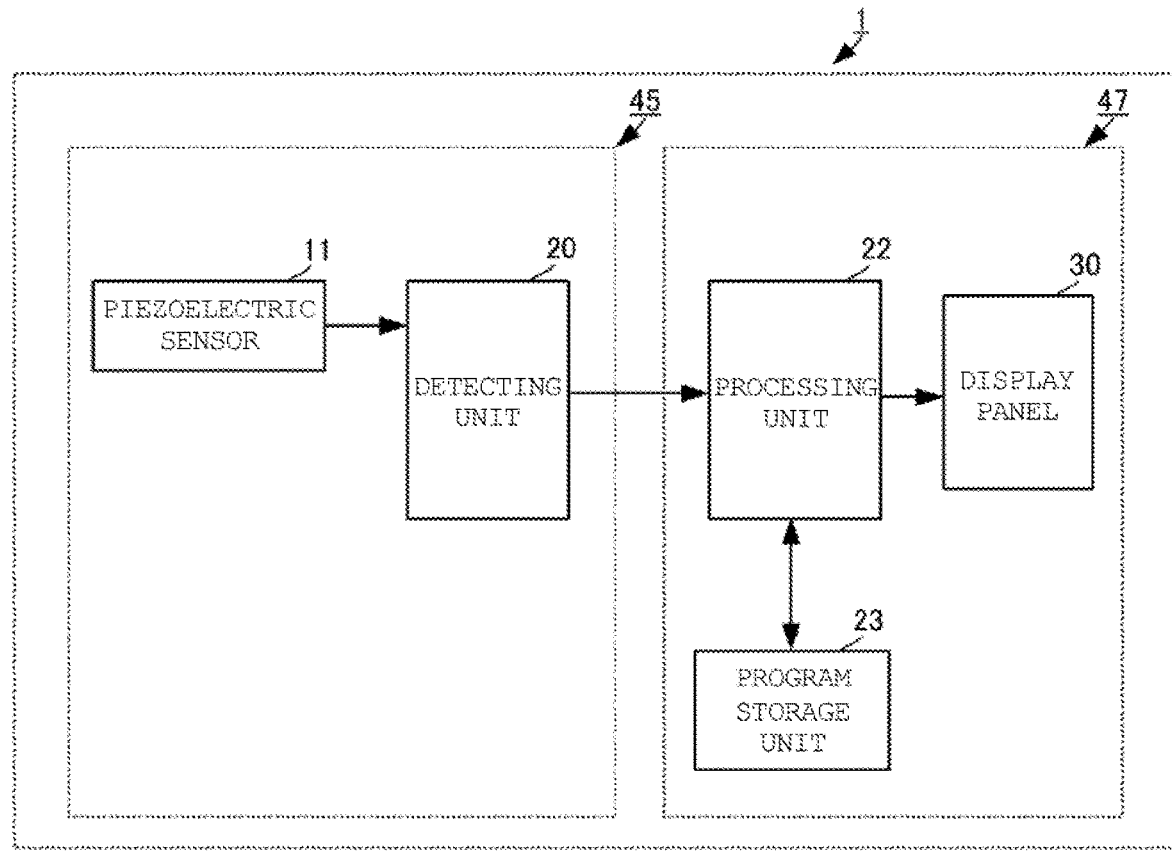
FIG. 4 is a block diagram of the display device.

As illustrated in FIG. 4, the piezoelectric sensor 11 and a processing unit 22 are connected to the detecting unit 20. The detecting unit 20, a program storage unit 23, and the display 30 are connected to the processing unit 22.

The display 1 includes a touch input device 45 including the piezoelectric sensor 11 and the detecting unit 20 and a processing device 47 including the processing unit 22, the program storage unit 23 and the display panel 30.

The processing unit 22 includes a CPU, and integrally controls the processing device 47. Specifically, the processing unit 22 reads an operation program stored in the program storage unit 23, and performs various types of processing. For example, the processing unit 22 controls the display panel 30 to display images, determines operation input contents according to a detection signal input from the detecting unit 20, and changes the displayed images.

The piezoelectric sensor 11 produces electric charges corresponding to a pressing operation (i.e., a pressing force) on the surface panel 40 which is the operation surface. The detecting unit 20 detects the electric charges produced by the piezoelectric sensor 11, and outputs the electric charges as a detection signal to the processing unit 22.

The display panel 30 is formed by, for example, a liquid crystal display element. Although not illustrated, the display panel 30 includes a front polarizing plate, a liquid crystal panel, and a back polarizing plate.

Figure 3:
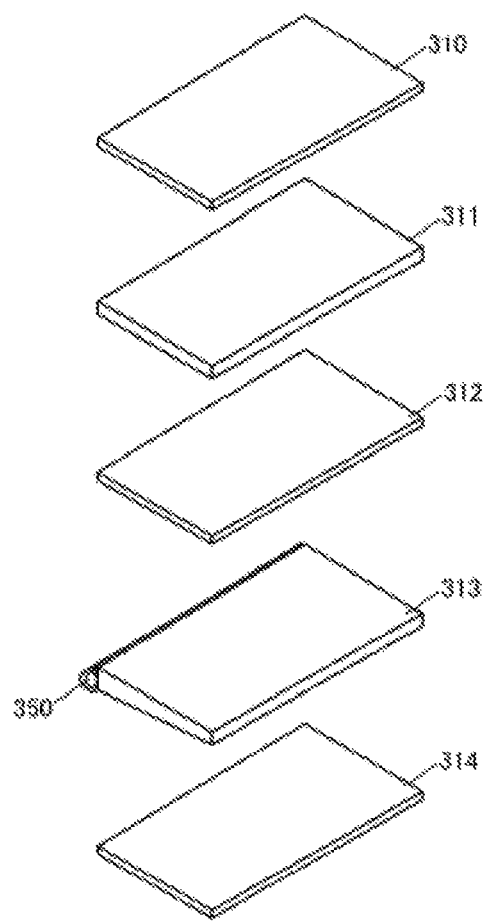
FIG. 3 is an exploded perspective view of a backlight unit.

As illustrated in FIGS. 2 and 3, the backlight 31 includes a first diffusion sheet 310, a prism sheet 311, a second diffusion sheet 312, a light guide plate 313, and a reflection sheet 314 in that order from a top surface side of the display device 1 as viewed in FIG. 1. In addition, the backlight 31 includes a light source 350 that allows light to enter the light guide plate 313.

The light guide plate 313 takes in the light from the light source 350, and outputs light having uniform intensity within the surface toward the top surface side of the light guide plate 313 (as viewed in FIG. 3). The reflection sheet 314 reflects the portion of the light output from the light guide plate 313 which exits the back surface side of the light guide plate 313.

The second diffusion sheet 312 diffuses the light output from the light guide plate 313. The prism sheet 311 concentrates a divergence angle of the light, which is diffused by the second diffusion sheet 312, within a predetermined angle range. The first diffusion sheet 310 diffuses the light, which is output from the prism sheet 311, one more time.

The light output from the backlight 304 in this manner is input to the display panel 30. A drive circuit is connected to the display panel 30 and the amount of transmitted light is changed for each pixel. As a result, various images are displayed on the surface panel 40.

The piezoelectric sensor 11 includes a first electrode 111, a piezoelectric film 112, and a second electrode 113 in that order from the top surface side. The first and second electrodes 111 and 113 cover substantially the entire opposed principal surfaces (i.e., the upper and lower surfaces as viewed in FIG. 2) of the piezoelectric film 112.

The first and second electrodes 111 and 113 are made of, for example, aluminum. Alternatively they may be made of a material having transparency. Examples of the material having transparency include materials containing indium tin oxide (ITO), zinc oxide (ZnO), and polythiophene as main components. The first and second electrodes 111 and 113 are formed on respective principal surfaces of a PET film or the like in advance by vapor deposition or the like. Note that a material such as aluminum that does not transmit light therethrough may be used for either one or both of the first electrode and the second electrode.

The piezoelectric film 112 deflects in a normal direction when the user presses downwardly (as viewed in FIG. 1) on the surface panel 40, and produces electric charges in response thereto. The piezoelectric film 112 is preferably made of a PVDF or a chiral polymer. When a chiral polymer is used for the piezoelectric film 112, it is more preferably uniaxially stretched polylactic acid (PLA), and is still more preferably poly L-lactic acid (PLLA).

The main chain of the chiral polymer adopts a helical structure, and has piezoelectricity when the chiral polymer is uniaxially stretched and molecules thereof are oriented. Further, an amount of electric charges produced by the uniaxially stretched chiral polymer is uniquely determined by shear distortion applied along a molecular axis of the helical molecules.

A piezoelectric constant of the uniaxially stretched PLLA belongs to a group of very high piezoelectric constants among polymers. That is, it is possible to detect a pressing operation with high sensitivity, and to precisely output a deformation detection signal corresponding to a pressing amount.

Further, the chiral polymer produces piezoelectricity by orientation processing of the molecules by stretching or the like, and therefore, there is no need to perform polling processing. In particular, the polylactic acid does not have pyroelectricity, and therefore, even when heat of the user's finger or the like is transmitted thereto, the amount of electric charges to be detected does not change. Further, the polylactic acid is not affected by heat generation of such an instrument or change in pressure sensitivity due to ambient temperature. In particular, it is effective to use the polylactic acid for small electronic instruments such as smart phones and tablet terminals, in which batteries likely to generate heat and piezoelectric films are disposed closely to each other. Moreover, the piezoelectric constant of the PLLA does not fluctuate over time and is extremely stable.

When the surface panel 40 is pushed down (pressed) by the user, elongation or shrinkage in the horizontal direction (the x-y plane in FIG. 1) occurs in the piezoelectric film laminated on the display panel 40. It is desirable to arrange the molecular axis so that, in the elongation or shrinkage by the push-down operation, the shear distortion occurs with respect to the molecular axis of the helical molecules. In the uniaxially stretched polylactic acid film, the helical molecules contributing to the piezoelectricity are oriented in a direction of a stretching axis. In the present embodiment, the piezoelectric film 112 is disposed such that a uniaxial stretching direction L1 forms an angle of approximately 45° with respect to the X direction and the Y direction. By disposing the piezoelectric film 112 in this manner, it is possible to detect the pressing operation with higher sensitivity. Note that, though it is most effective that the uniaxial stretching direction L1 is 45°, substantially the same effect can be obtained even if the uniaxial stretching direction L1 is in a range of 45±10°, for example.

Note that, preferably, a stretching ratio is approximately three to eight times. By performing heat treatment after the stretching, crystallization of extended chain crystals of polylactic acid is promoted, so that the piezoelectric constant increases. Further, when the piezoelectric film is biaxially stretched, it is possible to provide the same effect as that of the uniaxial stretching by varying stretching ratios of the respective axes. For example, when a given direction is the X axis and the film is stretched to eight times the film in the X axis direction and is stretched to twice the film in the Y axis direction orthogonal to the X axis, it is possible to provide substantially the same effect in terms of the piezoelectric constant as an effect obtained when the film is uniaxially stretched to four times the film in the X axis direction. A simply uniaxially stretched sheet is likely to be broken in a stretching axis direction, and therefore, it is possible to enhance the strength to some degree by the biaxially stretching as described above.

When the piezoelectric film 112 is not perfectly transparent, it is necessary to perform color calibration in consideration of the display performance. In addition, a display screen may be darkened by the piezoelectric film 112. In this case, since the backlight needs to be made to emit light with higher luminance, problems such as large consumption of a battery occur. However, the piezoelectric sensor 11 of the present embodiment is provided on one side (back surface side) of the principal surface of the reflection sheet 314 which is a reflecting member. Therefore, the piezoelectric sensor 11 does not affect the display performance of the display panel 30.

If noise penetrates the piezoelectric sensor 11, it is difficult to distinguish whether the electric charges are caused by the noise or produced by the pressing operation in a pressing detecting circuit such as the detecting unit 20 connected to the piezoelectric sensor 11. Therefore, there may possibly occur misdetection that the piezoelectric sensor 11 is pressed, although the piezoelectric sensor 11 is not pressed. Note that, it is conceivable to distinguish whether or not the electric charges are caused by the noise through the processing of the detecting unit 20, but a complicated electrical circuit is required in this case.

Since the piezoelectric sensor 11 is provided on the back surface side of the backlight 31 (i.e., the bottom surface of the backlight 31 as viewed in FIG. 2), the noise generated from the display panel 30 does not affect (or at least has much less effect) on the detection signal.

Further, in the piezoelectric sensor 11, the first electrode 111 on the top surface side is a ground electrode. Since an electrode on the side close to the display panel 30 is the ground electrode, the noise generated from the display panel 30 is blocked in the piezoelectric sensor 11. Therefore, the detecting unit 20 connected to the piezoelectric sensor 11 can appropriately detect the detection signal.

When static electricity intrudes from the display panel surface, the circuit may be damaged via the first electrode 111 or the second electrode 113. Therefore, when viewed from the front of the display panel, it is preferable that the first and second electrodes 111 and 113 be designed so as not to protrude outwardly from an LCD or the touch panel. This can be done, for example, by etching the outer peripheries of the first electrode 111 and the second electrode 113, or making the first electrode 111 and the second electrode 113 slightly smaller than the LCD touch panel.

Note that, when the first electrode 111 of the piezoelectric sensor 11 is made of a conductive material such as aluminum, which has a flat reflected light spectrum in the visible light band, the first electrode 111 can also function as the reflection sheet 314. The reflection sheet 314 is preferably formed by vapor-depositing aluminum on both sides of a polyester film, a polyethylene film or the like in many cases, but if the thickness of aluminum is reduced, the function as the reflection sheet may possibly deteriorate (transmit light). However, when the first (top) electrode 111 of the piezoelectric sensor 11 is made of the conductive material such as aluminum which has specular reflection, the function of the reflection sheet 314 can be complemented by the first electrode 111. Therefore, a reflection film of the reflection sheet 314 can be made thinner or formed on one side, and cost can be reduced. Further, also for the second (bottom) electrode 113, such a material as aluminum, which does not transmit light therethrough, can be used. In this manner, it is possible to make the instrument thinner while obtaining a good light reflection effect.

Figure 5:
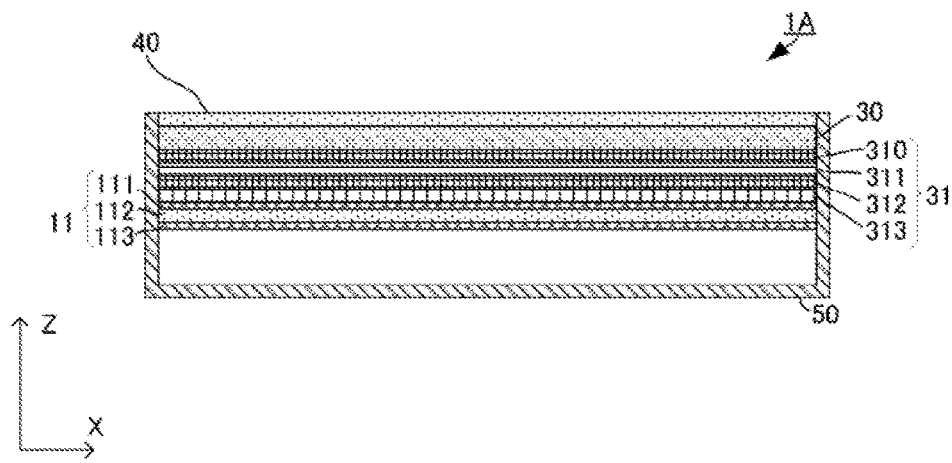
FIG. 5 is a cross-sectional side view of a display device in Modified Example 1.

Further, as illustrated in a cross-sectional side view of a display device 1A according to Modified Example 1 of FIG. 5, it is also possible to omit the reflection sheet 314. In this case, the first electrode 111 of the piezoelectric sensor 11 functions as both the ground electrode and the reflection sheet.

Figure 6:
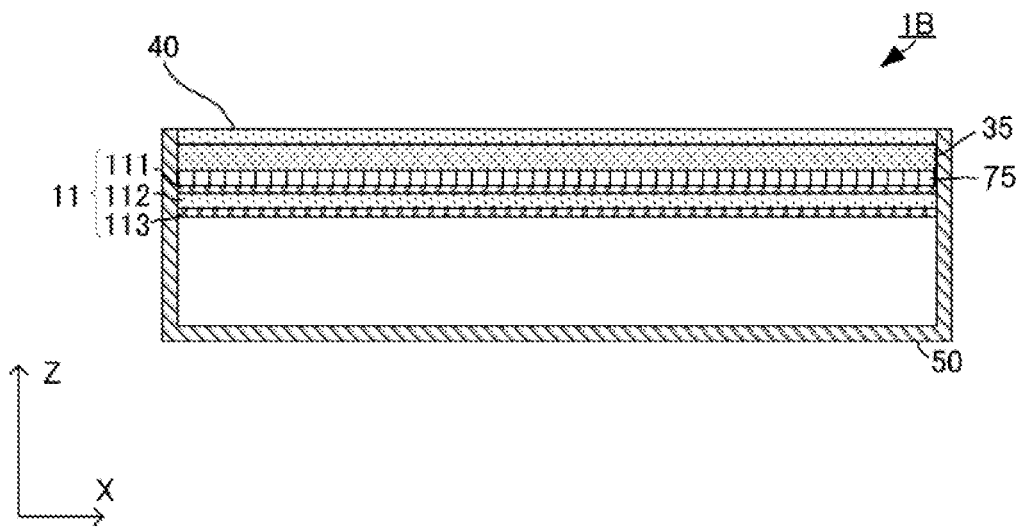
FIG. 6 is a cross-sectional side view of a display device in Modified Example 2.

Next, FIG. 6 is a cross-sectional side view illustrating a configuration of a display device 1B according to Modified Example 2. Components common to those in FIG. 2 are designated by the same reference numerals, and repeated description is omitted.

The display device 1B includes an OLED panel 35 and a light shielding member (light shielding sheet) 75 in place of the display panel 30. The piezoelectric sensor 11 is provided on the back (bottom) surface side of the light shielding sheet 75.

As described above, even when the display device uses an OLED display panel that does not require a backlight, the piezoelectric sensor 11 is preferably disposed on the back (bottom) surface side of the display panel (OLED panel 35) with the light shielding sheet 75 interposed between the OLED panel 35 and the piezoelectric sensor 11 so that the display performance is not affected by the piezoelectric sensor 11. Further, also in this example, the first electrode 111 on the top surface side of the piezoelectric sensor 11 is the ground electrode, and therefore, the noise generated from the OLED panel 35 is blocked by the ground electrode.

Therefore, the detecting unit 20 connected to the piezoelectric sensor 11 can appropriately detect the detection signal.

Figure 7:
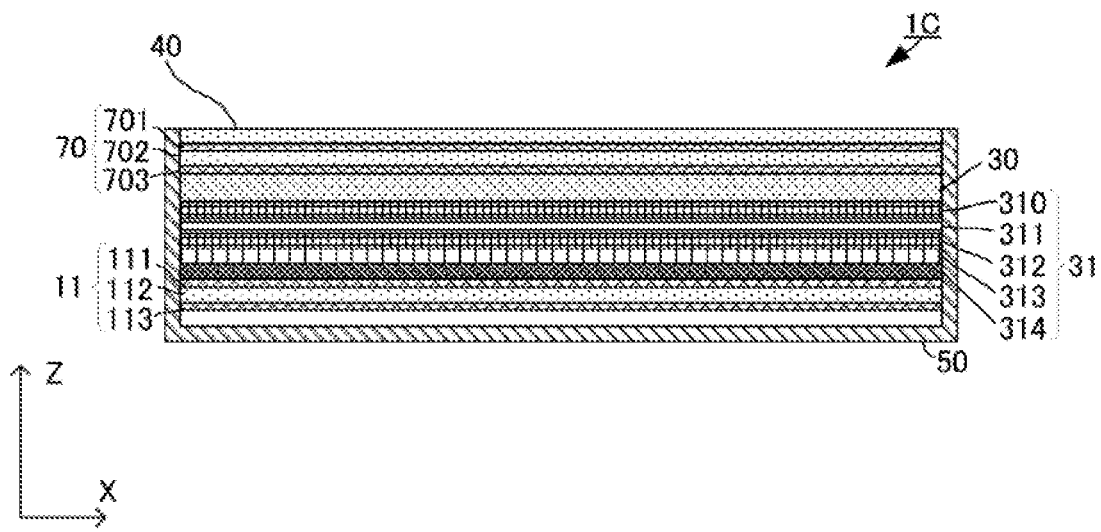
FIG. 7 is a cross-sectional side view of a display device in Modified Example 3.

Next, FIG. 7 is a cross-sectional side view illustrating a configuration of a display device 1C according to Modified Example 3. Components common to those in FIG. 2 are designated by the same reference numerals, and repeated description is omitted.

In this embodiment, a capacitance sensor 70 has been added to the display device 1C. The capacitance sensor 70 is disposed closer to the surface panel 40 than the piezoelectric sensor 11. That is, the respective constituents are arranged such that the capacitance sensor 70, the display panel 30, the backlight unit 31, and the piezoelectric sensor 11 are disposed in that order along the Z direction from the surface panel 40 downwardly as viewed in FIG. 7.

The capacitance sensor 70 has a flat shape and is disposed inside the housing 50 so as to face or extend along the opening (filled by the surface panel 40) of the housing 50.

The capacitance sensor 70 includes a first capacitance detection electrode 701, an insulation substrate 702 having a flat shape, and a second capacitance detection electrode 703. The insulation substrate 702 is made of a material having transparency, and is made of, for example, PMMA (acrylic resin). The first capacitance detection electrode 701 is formed on the principal surface on the top surface side of the insulation substrate 702, and the second capacitance detection electrode 703 is disposed on the principal surface on the back surface side thereof.

Both the first capacitance detection electrode 701 and the second capacitance detection electrode 703 are made of a material having transparency. For example, a material of which main components are indium tin oxide (ITO), zinc oxide (ZnO), and polythiophene is used.

The capacitance sensor 70 detects whether or not a touch operation is performed and detects the touch position, based on a change in electrostatic capacitances detected by the first capacitance detection electrode 701 and the second capacitance detection electrode 703 in a manner known in the art.

In the display device 1C according to Modified Example 3, the piezoelectric sensor 11 is disposed on the back (bottom) surface side of the display panel 30 with the backlight 31 interposed therebetween, and therefore, the display performance is not affected. Further, also in this example, the first electrode 111 on the top surface side of the piezoelectric sensor 11 is the ground electrode, and therefore, the noise generated from the display panel 30 is blocked by the ground electrode. The noise generated from the capacitance sensor 70 is also blocked by the ground electrode. Therefore, the detecting unit 20 connected to the piezoelectric sensor 11 can appropriately detect the detection signal.

Figure 8:
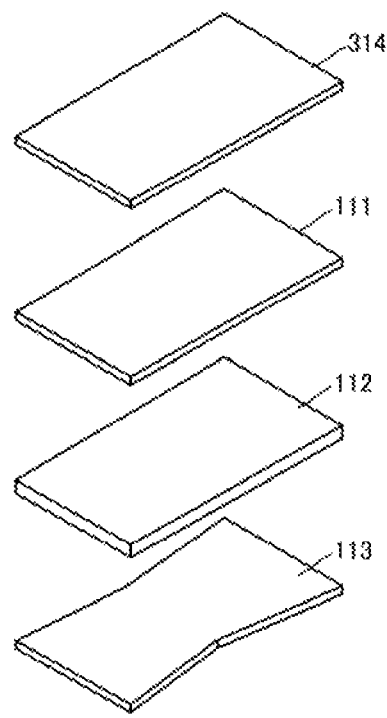
FIG. 8 is an exploded perspective view of a piezoelectric sensor according to Modified Example 1.

Next, FIG. 8 is an exploded perspective view of the piezoelectric sensor 11 according to Modified Example 1. In the second electrode 113 of the piezoelectric sensor 11 according to Modified Example 1, in plan view, vicinities of centers in the longitudinal direction of two long sides thereof are narrowed down toward the center of the second electrode 113. Specifically, the second electrode 113 is not provided over the entire surface of the piezoelectric film 112, but is partially cut off (omitted). As a result, the area of the second electrode 113 is smaller than that of the first electrode 111.

In order to ensure a waterproof/dustproof function, the surface panel 40 may be fixed to the housing 50 at an entire outer peripheral edge portion thereof. In this case, for example, when the center position of the surface panel 40 is pressed in plan view, the center position of the piezoelectric film 112 is distorted in the back surface direction. However, since the vicinities of the long sides of the piezoelectric film 112 are fixed to the housing 50, the vicinities become distorted in the direction opposite to the center position, and regions where the polarity of the generated voltages (electric charges) is inverted are formed. The detecting unit 20 connected to the piezoelectric sensor 11 detects the detection signal by summing all the voltages (electric charges) generated according to the strain amount of the piezoelectric film 112. Therefore, when the voltage polarity inversion regions exist in the piezoelectric film 112, the generated voltages (electric charges) are canceled out and the pressing force cannot be accurately detected. The detection sensitivity also decreases. Therefore, the second electrode 113 is preferably not provided on the piezoelectric sensor 11 in such polarity inversion regions.

Also in this case, the first electrode 111 on the top surface side is provided over the entire surface of the piezoelectric film 112, and is the ground electrode, and therefore, the noise generated from the display panel 30 is blocked by the ground electrode.

Figure 9:
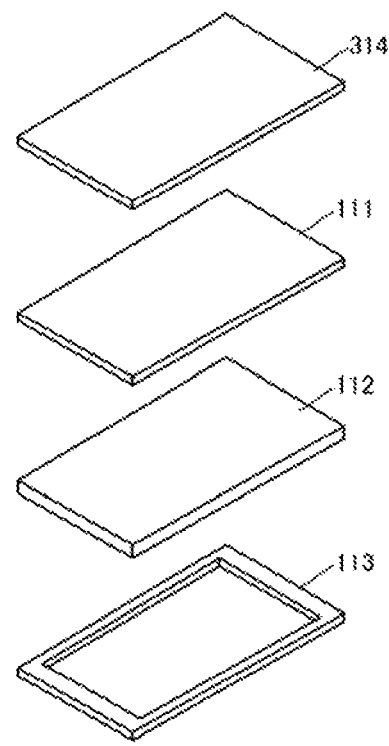
FIG. 9 is an exploded perspective view of a piezoelectric sensor according to Modified Example 2.

FIG. 9 is an exploded perspective view of the piezoelectric sensor 11 according to Modified Example 2. The second electrode 113 of the piezoelectric sensor 11 according to Modified Example 2 is formed only in a peripheral edge portion in plan view.

In plan view, the piezoelectric film 112 has a large strain amount in the vicinity of the center position, and has a small strain amount in the peripheral edge portion. That is, even with the same pressing amount, the amount of generated electric charges varies depending on the pressing position. Accordingly, the second electrode 113 of the piezoelectric sensor 11 according to Modified Example 2 does not take out the generated electric charges in the vicinity of the center position where the amount of electric charges varies depending on the pressing position, but takes out the electric charges from only the peripheral edge portion where there are few variations depending on the pressing position.

Also in this case, the first electrode 111 on the top surface side is provided over the entire surface of the piezoelectric film 112, and is the ground electrode, and therefore, the noise generated from the display panel 30 is blocked by the ground electrode. It is preferable that the first electrode 111 be uniformly provided over the entire surface of the piezoelectric film. As a result, it is possible to effectively block the noise and eliminate the need for patterning, which facilitates manufacturing.

On the other hand, it is not an essential requirement in the present invention that the first electrode 111 is uniformly provided over the entire surface of the piezoelectric film. As long as the effect of the present invention can be obtained, there may be regions where the electrodes are not partially formed by patterning.

Figure 10:
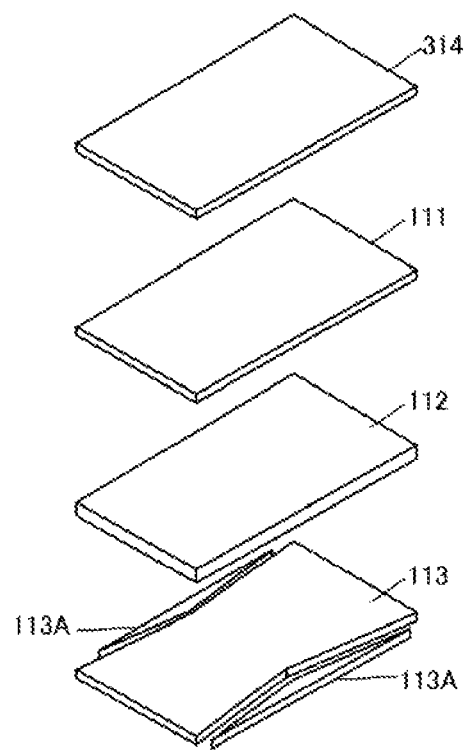
FIG. 10 is an exploded perspective view of the piezoelectric sensor according to Modified Example 1.

FIG. 10 is an exploded perspective view illustrating an example in which dummy electrodes 113A are provided at spots where the second electrode 113 is not formed in the piezoelectric sensor 11 according to Modified Example 1.

As mentioned above, when the thickness of the reflection sheet 314 is reduced, the function as the reflection sheet may possibly deteriorate (transmit light). In addition, even when the first electrode 111 is made of a conductive material such as aluminum, there is a case that not all of the light can be reflected by the first electrode 111. Here, when the piezoelectric film 112 is a material such as PLLA, which has high transparency, the light may also be transmitted to the second electrode 113 side. In this case, the dummy electrodes 113A are provided, and the light is reflected by the second electrode 113 and the dummy electrodes 113A, whereby the function of the reflection sheet 314 can be more appropriately assisted.

Note that the piezoelectric sensor 11 may invert the voltages detected by the dummy electrodes 113A (or invert the voltage detected by the second electrode 113 on the contrary) and add the detected voltages to the voltage detected by the second electrode 113, thereby to detect the detection signal.

Figure 11A:
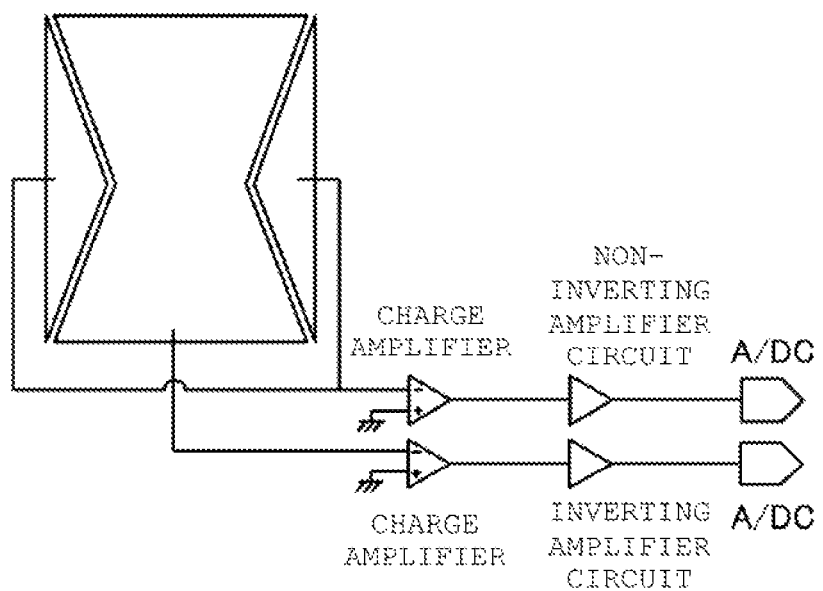
FIG. 11A is a circuit diagram of the piezoelectric sensor according to Modified Example 1.

FIG. 11A is a specific circuit diagram. The second electrode 113 of the piezoelectric sensor 11 is connected to an inverting input terminal of a differential amplifier. The dummy electrodes 113A are connected to a non-inverting input terminal of the charge amplifier. An output terminal of the charge amplifier for the second electrode 113 is connected to a non-inverting amplifier circuit whose output is connected to an A/D converter circuit. An output terminal of the differential amplifier for the dummy electrodes 113A is connected to an inverting amplifier circuit whose output is connected to an A/D converter circuit.

In FIG. 11B, the second electrode 113 and dummy electrodes 113A of the piezoelectric sensor 11 are connected to respective switches and are further connected to the non-inverting input terminal of the same operational amplifier. An output terminal of the differential amplifier is connected to the non-inverting amplifier circuit whose output is connected to the A/D converter circuit. Outputs of the second electrode 113 and dummy electrodes 113A of the piezoelectric sensor 11 are respectively stored in a calculation unit. The calculation unit detects a difference between the stored outputs as a pressing force.

Figure 11C:
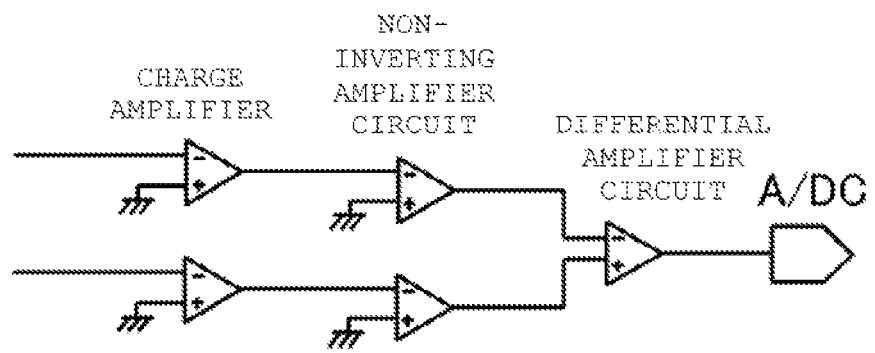
FIG. 11C is a circuit diagram of the piezoelectric sensor according to Modified Example 1.

In FIG. 11C, the second electrode 113 and dummy electrodes 113A of the piezoelectric sensor 11 are connected to the non-inverting input terminal of the differential amplifier. The output terminals of the differential amplifiers for the second electrode 113 and dummy electrodes 113A are connected to an inverting amplifier circuit. Further, the output terminal of the inverting amplifier circuit for the second electrode 113 is connected to a + terminal of a differential amplifier circuit, and is connected to the A/D converter circuit. The output terminal of the non-inverting amplifier circuit for the dummy electrodes 113A is connected to an inverting input terminal of the differential amplifier circuit, and is connected to the A/D converter circuit.

By adopting such a circuit configuration, wires can be formed on the same plane or on one principal surface side of the piezoelectric film, so that vias can be eliminated in a wiring path and an output loss can be suppressed. In particular, this circuit configuration is effective in case of handling a very small signal as in a piezoelectric film sensor.

Further, an in-plane distribution of pressing force sensitivity can be improved by changing an amplification factor of the amplifiers connected to the dummy electrode side and the second electrode side.

Figure 12:
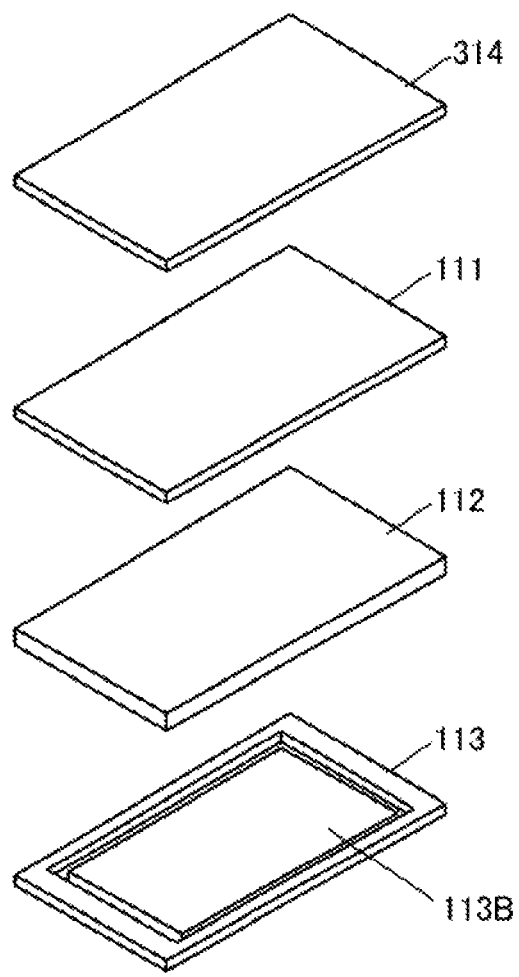
FIG. 12 is an exploded perspective view of the piezoelectric sensor according to Modified Example 2.

FIG. 12 is an exploded perspective view illustrating an example in which a dummy electrode 113B is provided at locations where the second electrode 113 is not formed in the piezoelectric sensor 11 according to Modified Example 2.

In this case, similarly to the example of FIG. 10, the light is reflected by the second electrode 113 and the dummy electrode 113B, whereby the function of the reflection sheet 314 can be more efficiently achieved.

Figure 13:
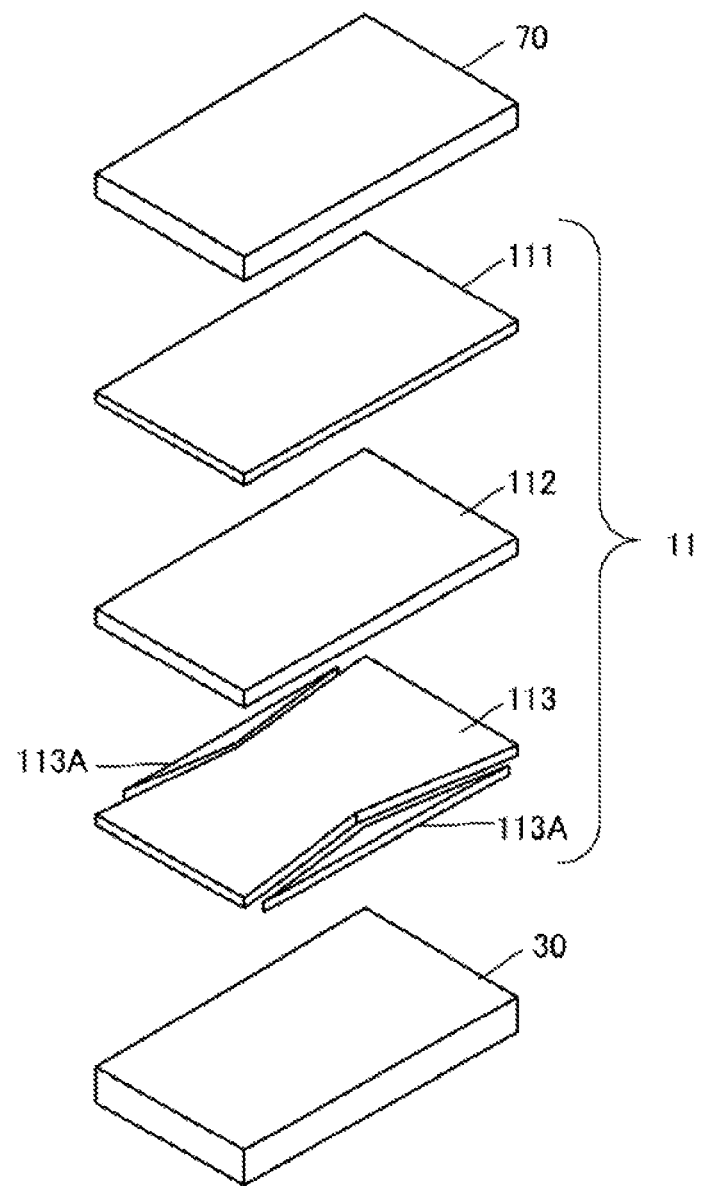
FIG. 13 is an exploded perspective view of the display device according to Modified Example 3.

FIG. 13 is an exploded perspective view illustrating an example in which the piezoelectric sensor 11 is provided on the other side of the display panel 30 in the piezoelectric sensor according to Modified Example 3.

Also in this case, the first electrode 111 on the top surface side of the piezoelectric sensor 11 is provided over the entire surface of the piezoelectric film 112, and is the ground electrode, and therefore, the noise generated from the capacitance sensor 70 is blocked by the ground electrode. As mentioned above, the back surface side of the piezoelectric sensor 11 may be composed of the second electrode 113 and the dummy electrodes 113A.

Note that, as mentioned above also in this case, the piezoelectric sensor 11 may invert the voltages detected by the dummy electrodes 113A (or invert the voltage detected by the second electrode 113 on the contrary) and add the detected voltages to the voltage detected by the second electrode 113, thereby to detect the detection signal. The circuit is as illustrated in FIG. 11.

Further, a shield electrode for blocking the noise of the display panel 30 may be provided on the back surface side of the second electrode 113.

Note that an insulating film (not illustrated) may be formed on the principal surface on the non-display surface side of the second electrode 113. On the non-display surface side of the second electrode 113, a metal plate such as a chassis may be disposed. When the second electrode is disposed in an exposed state, and the chassis and the second electrode 113 come into contact with each other when the piezoelectric sensor 11 is pressed, there is a possibility that a desired characteristic cannot be obtained due to a short circuit or damage of the second electrode 113. Further, even when the chassis or the like is not provided, a back surface of the housing and the second electrode 113 may come into contact with each other when the piezoelectric sensor 11 is pressed, which may result in a scratch of the second electrode 113. Therefore, the insulating film (not illustrated) is formed on the principal surface on the non-display surface side of the second electrode 113, whereby it is possible to prevent the second electrode 113 from being scratched or causing a short circuit. Note that the insulating film may be a film of PET or the like, or may be a resist.

DESCRIPTION OF REFERENCE SYMBOLS

1: display device
11: piezoelectric sensor
20: detecting unit
22: processing unit
23: program storage
30: display panel
31: backlight unit
35: OLED panel
40: surface panel
45: touch input device
47: processing device
50: housing
70: capacitance sensor
75: light shielding sheet
111: first electrode
112: piezoelectric film
113: second electrode
113A, 113B: dummy electrode
304: backlight
310: first diffusion sheet
311: prism sheet
312: second diffusion sheet
313: light guide plate
314: reflection sheet
350: light source
701: first capacitance detection electrode

702: insulation substrate
703: second capacitance detection electrode

The invention claimed is:

1. A display device, comprising:
a surface panel having first and second opposed main surfaces, the first main surface of the surface panel being an operation surface to which an operator may apply a touch and/or pressing operation;
an image display provided on the second main surface of the surface panel;
a light reflector;
a light source located between the light reflector and the image display for outputting light to the image display, at least some of the light outputted by the light source being reflected off of the light reflector and toward the image display; and
a piezoelectric element comprising:
 a piezoelectric sheet having a rectangular shape with a center, first and second opposed main surfaces, a pair of opposed long sides and a pair of opposed short sides, the long sides being longer than the short sides and being supported along their entire lengths such that when a pressing force is applied to the center of the piezoelectric sheet, the center of the piezoelectric sheet will move in a first direction and a portion of the long sides of the piezoelectric sheet located closest to the center of the piezoelectric sheet will move in a second direction, opposite to the first direction, whereby charges generated at the center of the piezoelectric sheet will be of opposite polarity to charges generated at the portion of the long sides of the piezoelectric sheet located closest to the center of the piezoelectric sheet;
 a first electrode located on the entire first main surface of the piezoelectric sheet such that the first electrode faces the light source and acts as a shield electrode between the piezoelectric sheet and the image display, and
 a second electrode located on only a portion of the second main surface of the piezoelectric sheet, the second electrode being spaced from the portion of the long sides of the piezoelectric sheet located closest to the center of the piezoelectric sheet such that charges generated at the portion of the long sides of the piezoelectric sheet located closest to the center of the piezoelectric sheet are not detected by the second electrode.

2. The display device according to claim 1, wherein the first electrode is formed of a light reflecting material and serves as the reflector.

3. The display device according claim 1, wherein the first electrode is formed of a light reflecting material and serves, in addition to the reflector, to reflect light emitted by the light source towards the image display.

4. The display device according to claim 1, wherein at least part of an area of the second main surface of the piezoelectric sheet that is not covered by the second electrode is covered by one or more dummy electrodes.

5. The display device according to claim 1, wherein the piezoelectric sheet contains polylactic acid.

6. The display device according to claim 1, further comprising a capacitive touch sensor located between the image display and the surface panel.

7. The display device according to claim 1, wherein the second electrode is the only electrode on the second surface of the piezoelectric sheet.

8. The display device according to claim 1, wherein the second electrode abuts the portions of the long sides of the piezoelectric sheet at positions furthest from the center of the piezoelectric sheet.

9. The display device according to claim 8, wherein the second electrode has an hourglass shape.

* * * * *